(12) United States Patent
Imanishi et al.

(10) Patent No.: US 8,803,561 B2
(45) Date of Patent: Aug. 12, 2014

(54) SEMICONDUCTOR CIRCUIT AND SEMICONDUCTOR DEVICE

(75) Inventors: Motoki Imanishi, Fukuoka (JP); Kenji Sakai, Fukuoka (JP); Yoshikazu Tanaka, Fukuoka (JP); Kyouko Oyama, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 16 days.

(21) Appl. No.: 13/228,903

(22) Filed: Sep. 9, 2011

(65) Prior Publication Data

US 2012/0154007 A1 Jun. 21, 2012

(30) Foreign Application Priority Data

Dec. 17, 2010 (JP) .................................. 2010-281548

(51) Int. Cl.
*H03K 3/00* (2006.01)
(52) U.S. Cl.
USPC .......................................... 327/108
(58) Field of Classification Search
None
See application file for complete search history.

(56) References Cited

U.S. PATENT DOCUMENTS 7,327,053 B2 * 2/2008 Eckardt et al. ................ 307/126
7,557,637 B2 * 7/2009 Sakamoto ..................... 327/519

FOREIGN PATENT DOCUMENTS

JP 9-172366 6/1997

* cited by examiner

*Primary Examiner* — Lincoln Donovan
*Assistant Examiner* — Khareem E Almo
(74) *Attorney, Agent, or Firm* — Oblon, Spivak, McClelland, Maier & Neustadt, L.L.P.

(57) ABSTRACT

A semiconductor circuit of the present invention comprises a capacitor for charging ON driven electric charges in response to an ON driving signal, a capacitor for charging OFF driven electric charges in response to an OFF driving signal, a signal generating circuit for generating a first trigger signal in response to the ON driving signal, a signal generating circuit for generating a second trigger signal in response to the OFF driving signal, a discharging circuit for discharging the ON driven electric charges in response to the second trigger signal, and a discharging circuit for discharging the OFF driven electric charges in response to the first trigger signal. With this configuration, it is possible to provide a semiconductor circuit and a semiconductor device both of which have a general-purpose malfunction prevention function by which a malfunction due to dV/dt can be prevented without being affected by any external factor.

10 Claims, 10 Drawing Sheets

SEMICONDUCTOR CIRCUIT AND SEMICONDUCTOR DEVICE

BACKGROUND OF THE INVENTION

1. Field of the Invention

The present invention relates to a semiconductor circuit and a semiconductor device, and more particularly to a semiconductor circuit and a semiconductor device both for driving a power semiconductor switching element.

2. Description of the Background Art

Some of level shift circuits included in semiconductor circuits which drive conventional power semiconductor switching elements perform, for example, a function for preventing a malfunction due to self-excited dV/dt (an abrupt change in a floating potential VM generated when a P-side semiconductor switching device is turned off) and another function for preventing a malfunction due to separately excited dV/dt (an abrupt change in a floating potential VM generated by ON/OFF operations of other arms) (see Paragraph [0014] and "Means for Solving the Problems" of Japanese Patent Application Laid Open Gazette No. 9-172366). In this case, dV/dt is an abrupt change in a reference potential generated by ON/OFF operations of a semiconductor switching device described later and can cause a malfunction.

In such a semiconductor circuit, the self-excited dV/dt is expected to be generated within a time period while an ON-side one-shot signal is inputted to a high voltage transistor.

There is a case, however, where no dV/dt is generated until the ON-side one-shot signal is finished because of light load driving of the semiconductor circuit, a delay in response of the P-side semiconductor switching device, a delay in transmission of the level shift circuit, and the like.

At that time, since a circuit structure for decreasing a resistance value of the other system is invalidated and the resistance value of the OFF side is higher than that of the ON side, when dV/dt is applied, an OFF-side pulse is transmitted earlier to a Set-Reset Flip-Flop and this disadvantageously turns off the P-side semiconductor switching device.

In order to avoid the above problem, it is necessary to increase the width of the one-shot signal to be sufficiently longer than the time period from the turn-on of the P-side semiconductor switching device to the application of the dV/dt thereto.

Increasing the width of the one-shot signal, however, arises a problem that a time period while the high voltage transistor is in an ON state becomes longer and the power consumed in the high voltage transistor is increased.

Further, since the time period from the turn-on of the P-side semiconductor switching device to the application of the dV/dt thereto depends on external factors such as the type of P-side semiconductor switching device (current-carrying capacity) and the load average of an inverter circuit or the like, the degree of design freedom for determining the width of the one-shot signal is lower.

SUMMARY OF THE INVENTION

It is an object of the present invention to provide a semiconductor circuit and a semiconductor device both of which have a general-purpose malfunction prevention function by which a malfunction due to dV/dt can be prevented without being affected by any external factor.

The present invention is intended for a semiconductor circuit. According to the present invention, the semiconductor circuit includes an output circuit for outputting an ON driving signal or an OFF driving signal, a first capacitor for charging ON driven electric charges in response to the ON driving signal, a second capacitor for charging OFF driven electric charges in response to the OFF driving signal, a first signal generating circuit for generating a first trigger signal in response to the ON driving signal, a second signal generating circuit for generating a second trigger signal in response to the OFF driving signal, an ON driven electric charge discharging circuit for discharging the ON driven electric charges in response to the second trigger signal, and an OFF driven electric charge discharging circuit for discharging the OFF driven electric charges in response to the first trigger signal.

According to the semiconductor circuit of the present invention, even if the dV/dt is applied beyond the period while the one-shot signal is inputted, it is possible to prevent any malfunction of a device without being affected by any external factor.

These and other objects, features, aspects and advantages of the present invention will become more apparent from the following detailed description of the present invention when taken in conjunction with the accompanying drawings.

DESCRIPTION OF THE PREFERRED EMBODIMENTS

A. The First Preferred Embodiment

Figure 10:
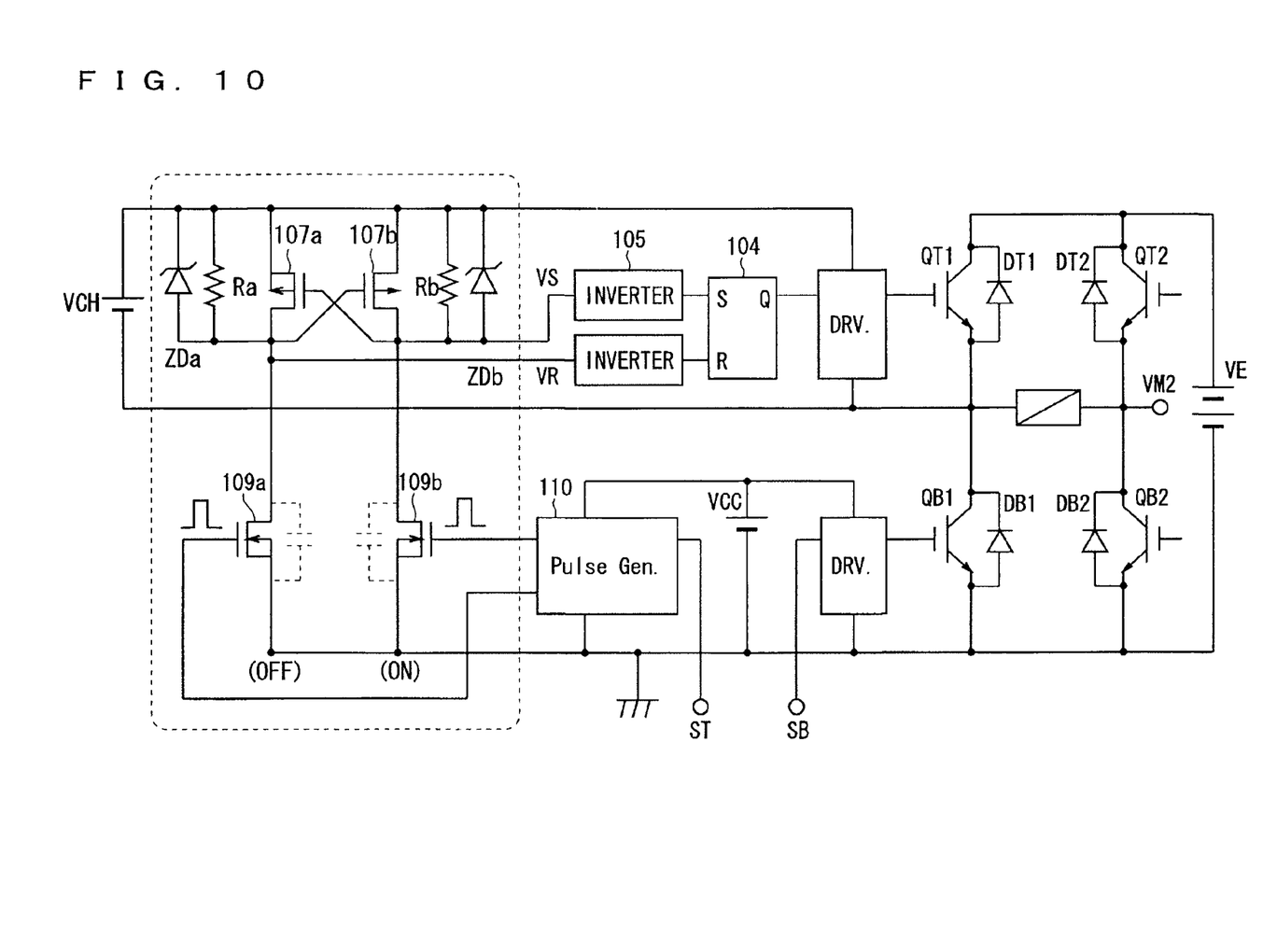
FIG. 10 is a circuit diagram showing a semiconductor circuit in accordance with an underlying technique.

FIG. 10 is a circuit diagram showing a semiconductor circuit (level shift circuit) in accordance with an underlying technique of the present invention, which is disclosed in Japanese Patent Application Laid Open Gazette No. 9-172366.

This level shift circuit uses respective one-shot signals both on ON/OFF sides to drive a high voltage transistors 109a and 109b and further uses a drain current and a resistance value which are thereby generated, to generate a voltage signal.

Between a system for transmitting an ON-side signal and a system for transmitting an OFF-side signal, interposed is a circuit structure for decreasing a resistance value in the other system at the instant when each signal is transmitted, and the circuit structure is set so that the voltage drop in resistors Ra and Rb due to the dV/dt can become larger in the system for transmitting the OFF-side signal.

When the generated voltage signal reaches a threshold value of a subsequent-stage inverter 105, an S signal and an R signal of a Set-Reset Flip-Flop 104 are inputted and by the output thereof, a P-side semiconductor switching device QT1 and an N-side semiconductor switching device QB1 are driven.

The P-side semiconductor switching device QT1 and the N-side semiconductor switching device QB1 are totem-pole connected (connected in series) to each other, and a driving circuit for driving the P-side semiconductor switching device QT1 and another driving circuit for driving the N-side semiconductor switching device QB1 are provided.

With the above-discussed configuration, as discussed earlier, the level shift circuit performs a function for preventing the malfunction due to self-excited dV/dt (an abrupt change in a floating potential VM generated when the P-side semiconductor switching device QT1 is turned off) and another function for preventing the malfunction due to separately excited dV/dt (an abrupt change in a floating potential VM generated by ON/OFF operations of other arms).

In this semiconductor circuit, as discussed earlier, the self-excited dV/dt is expected to be generated within a time period while the ON-side one-shot signal is inputted to the high voltage transistor 109a.

There is a case, however, where no dV/dt is generated until the ON-side one-shot signal is finished because of light load driving of the semiconductor circuit, a delay in response of the P-side semiconductor switching device QT1, a delay in transmission of the level shift circuit, and the like.

At that time, since a circuit structure for decreasing a resistance value of the other system is invalidated and the resistance value of the OFF side is higher than that of the ON side, when dV/dt is applied, an OFF-side pulse is transmitted earlier to the Set-Reset Flip-Flop 104 and this disadvantageously turns off the P-side semiconductor switching device QT1.

In order to avoid the above problem, it is necessary to increase the width of the one-shot signal to be sufficiently longer than the time period from the turn-on of the P-side semiconductor switching device QT1 to the application of the dV/dt thereto.

Increasing the width of the one-shot signal, however, arises a problem that a time period while the high voltage transistors 109a and 109b are in an ON state becomes longer and the power consumed in the high voltage transistors 109a and 109b is increased.

Further, since the time period from the turn-on of the P-side semiconductor switching device QT1 to the application of the dV/dt thereto (a period T2 in FIG. 3 discussed later) depends on external factors such as the type of P-side semiconductor switching device (current-carrying capacity) and the load average of an inverter circuit or the like, the degree of design freedom for determining the width of the one-shot signal is lower.

In the preferred embodiments below, discussion will be made on a semiconductor circuit which is intended for solving the above-discussed problem.

A-1. Constitution

Figure 1:
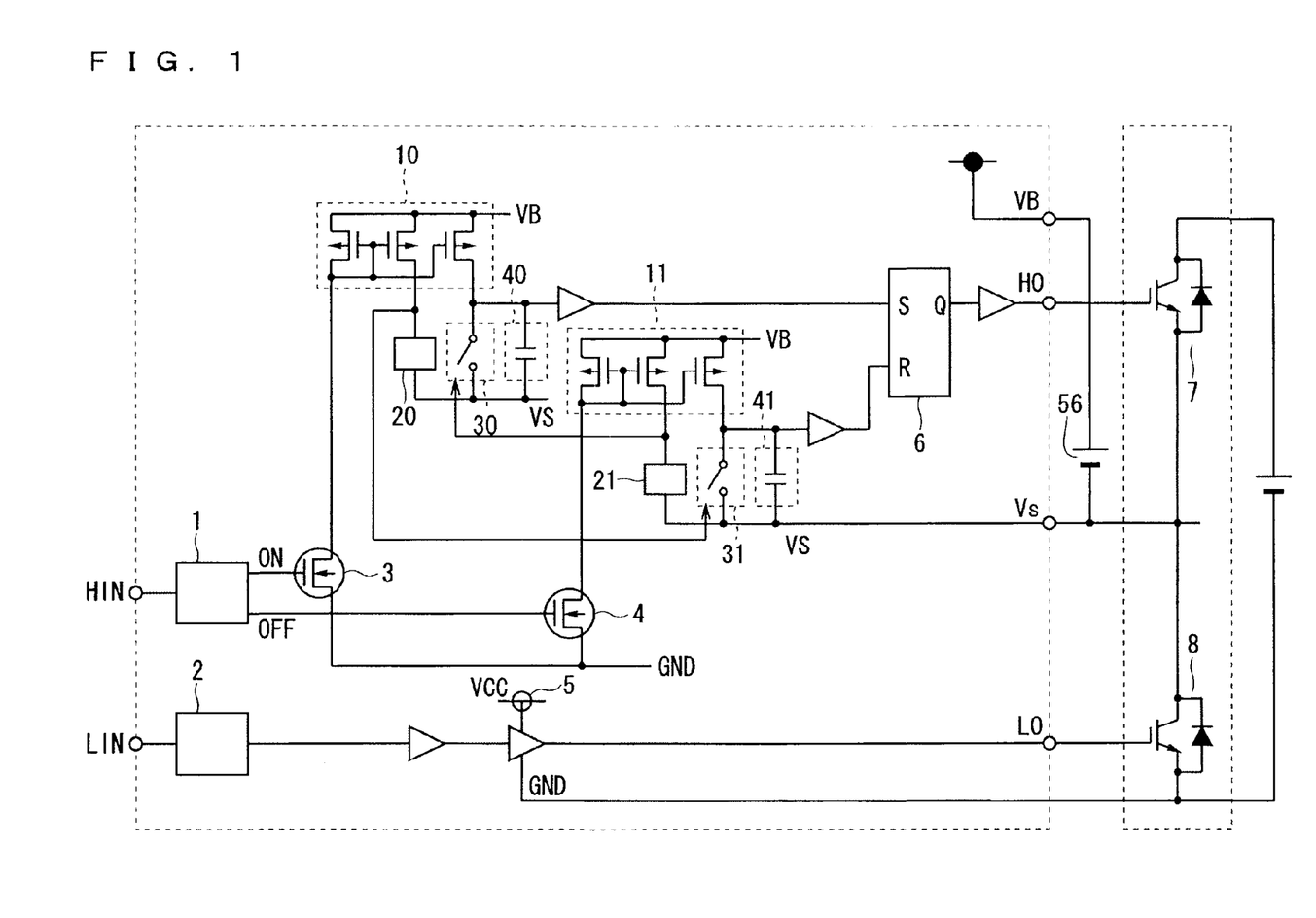
FIG. 1 is a circuit diagram showing a semiconductor circuit in accordance with a first preferred embodiment.

FIG. 1 is a circuit diagram showing a basic configuration of a semiconductor circuit in accordance with the present invention. This circuit has a level shift circuit which prevents a malfunction occurring when a VS potential which is a reference potential is changed, which is the problem in the inverter driving circuit having the level shift circuit, and the level shift circuit has a configuration in which a P-side driving circuit drives a P-side semiconductor switching device 7 and an N-side driving circuit drives an N-side semiconductor switching device 8.

Specifically, as shown in FIG. 1, the semiconductor circuit comprises a one-shot circuit 1 serving as an output circuit for outputting one-shot signals used as an ON driving signal and an OFF driving signal, a high voltage transistor 3 to which an ON-side one-shot signal (ON driving signal) among the one-shot signals outputted from the one-shot circuit 1 is inputted, a high voltage transistor 4 to which an OFF-side one-shot signal (OFF driving signal) among the one-shot signals outputted from the one-shot circuit 1 is inputted, a current mirror circuit 10 into which a drain current flows from the high voltage transistor 3, a current mirror circuit 11 into which a drain current flows from the high voltage transistor 4, a capacitor 40 serving as a first capacitor for charging ON driven electric charges in response to the ON driving signal, a capacitor 41 serving as a second capacitor for charging OFF driven electric charges in response to the OFF driving signal, a signal generating circuit 20 serving as a first signal generating circuit for outputting a first trigger signal in response to the current outputted from the current mirror circuit 10, a signal generating circuit 21 serving as a second signal generating circuit for outputting a second trigger signal in response to the current outputted from the current mirror circuit 11, a discharging circuit 30 serving as an ON driven electric charge discharging circuit for discharging the ON driven electric charges in the capacitor 40 in response to the second trigger signal, a discharging circuit 31 serving as an OFF driven electric charge discharging circuit for discharging the OFF driven electric charges in the capacitor 41 in response to the first trigger signal, a Set-Reset Flip-Flop 6 to which voltage signals which correspond to the charged ON driven electric charges and OFF driven electric charges are inputted, and a P-side semiconductor switching device 7 serving as a high-side semiconductor switching device for performing a switching operation in response to the output of the Set-Reset Flip-Flop 6.

Further, the N-side driving circuit uses a power supply 5 with GND as a reference potential to operate and comprises a signal processing circuit 2 for performing a filtering operation of an input signal from a LIN, or the like. The P-side driving circuit uses a floating power supply 56 with a node (VS) between the P-side semiconductor switching device and the N-side semiconductor switching device as a reference potential to operate.

Current signals which are transmitted to the current mirror circuits 10 and 11 are attenuated at a certain ratio and outputted to a high-side logic. By attenuating the current, it is possible to prevent wrong signals.

The charges which are charged by the capacitors 40 and 41 are discharged at respective timings determined by the second trigger signal and the first trigger signal generated by the signal generating circuits 21 and 20, respectively.

A-2-1. Operation in Case of No Change in VS Potential

Figure 2:
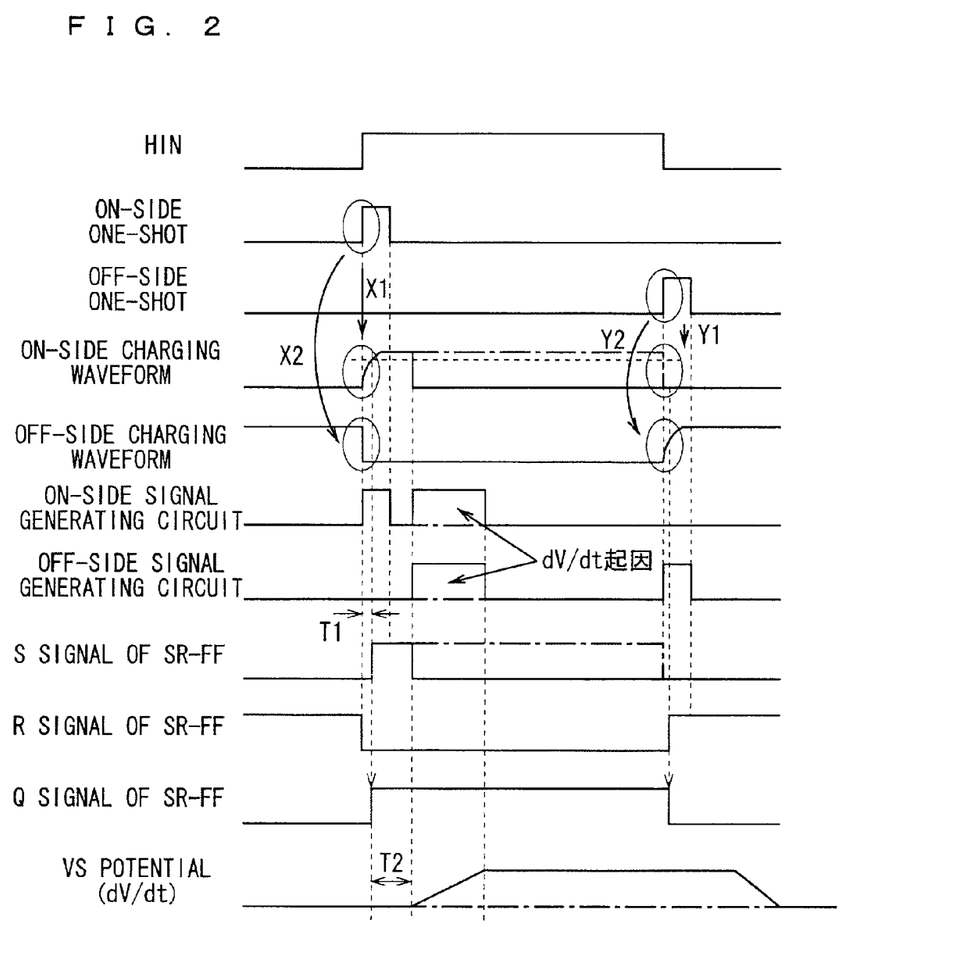
FIG. 2 is a view showing an operation sequence of the semiconductor circuit in accordance with the first preferred embodiment.

FIG. 2 is a view showing an operation sequence of the semiconductor circuit in accordance with the present invention. For explanation of the operation, operation waveforms in a case where no VS potential is changed are virtually shown by one-dot chain lines in FIG. 2.

By using an input signal inputted from a HIN, the one-shot signals (pulse signals) on the ON/OFF sides are generated. The rise of the input signal (pulse signal) to the HIN corresponds to the ON-side one-shot signal (ON driving signal) and the fall thereof corresponds to the OFF-side one-shot signal (OFF driving signal).

With the one-shot signals, the high voltage transistors 3 and 4 are driven, to thereby generate drain currents, respectively.

The respective drain currents which are generated are attenuated at a certain ratio in the current mirror circuits 10 and 11 and then outputted to the high-side logic.

The transmitted currents are charged into the capacitors 40 and 41 as the ON driven electric charges and the OFF driven electric charges, respectively, and converted into voltage signals (see X1 and Y2).

At that time, the filtering time for each of the capacitors 40 and 41 is obtained by t=CV/I where t, I, C, and V represent the filtering time, the attenuated current, the capacitance value, and the threshold value of a subsequent-stage buffer, respectively.

The ON driven electric charges charged into the capacitor 40 and the OFF driven electric charges charged into the capacitor 41 are discharged by using the second trigger signal generated by the signal generating circuit 21 and the first trigger signal generated by the signal generating circuit 20, respectively. The ON driven electric charges charged into the ON-side capacitor 40 are discharged at a timing determined by the second trigger signal generated by the OFF-side signal generating circuit 21, and the OFF driven electric charges charged into the OFF-side capacitor 41 are discharged at a timing determined by the first trigger signal generated by the ON-side signal generating circuit 20 (see X2 and Y1).

Therefore, the current signals transmitted from the one-shot signals through the high voltage transistors 3 and 4 and the current mirror circuits 10 and 11 are converted into an S (Set) signal and an R (Reset) signal each having a certain pulse width by the signal generating circuits 20 and 21 and the capacitors 40 and 41.

The S signal and the R signal are inputted to the Set-Reset Flip-Flop 6, to thereby operate the P-side semiconductor switching device 7.

A-2-2. Operation in Case of Change in VS Potential

Next, discussion will be made on an operation of the semiconductor circuit in accordance with the present invention for displacement currents (drain currents) generated when the VS potential is changed.

The dV/dt in a case where the VS potential is changed is applied, both the ON-side signal generating circuit 20 and the OFF-side signal generating circuit 21 generate signals simultaneously during the application (see FIG. 2).

Since the ON driven electric charges charged into the ON-side capacitor 40 continue to be discharged during the application of the dV/dt by the signal generated by the OFF-side signal generating circuit 21, both the S signal and the R signal of the latch are kept at low, being kept in the output state before the application of the dV/dt.

At that time, though the current mirror circuit 11 for charging the OFF-side capacitor 41 also operates, since the capacitor 41 serves as a filter (correspondingly to a period T1 in FIG. 2), the OFF driven electric charges are discharged with the first trigger signal from the signal generating circuit 20 earlier than the timing when the voltage signal reaches the threshold value V of the subsequent-stage buffer and the R signal is transmitted to the Set-Reset Flip-Flop 6. Therefore, there is no case where the R signal on the OFF side is transmitted to the Set-Reset Flip-Flop 6 by the application of the dV/dt, and it is thereby possible to prevent the malfunction.

A-2-3. Value Examples

Assuming that the drain current outputted from each of the high voltage transistors 3 and 4 is 10 mA, the current caused by the dV/dt is 2 mA, C=2 pF, V=10 V, and the mirror ratio is 20:1, the filtering capability in a normal case is obtained by t=CV/I=2 p×10/500 µA=40 ns. This is a level which does not affect a delay in signal transmission in a normal case.

On the other hand, in the case where the VS potential is changed by the application of dV/dt, the filtering capability in the case where the VS potential is changed is obtained by t=CV/I=2 p×10/100 µA=200 ns. Therefore, for example, the OFF driven electric charges in the capacitor 41 can start to be discharged with the first trigger signal from the signal generating circuit 20 earlier than the transmission of the R signal to the Set-Reset Flip-Flop 6 by 200 ns.

Further, even if there arises a difference in the timing for the generation of the signals in the ON-side signal generating circuit 20 and the OFF-side signal generating circuit 21 at the time when the dV/dt is applied, due to the parasitic capacitances of the two high voltage transistors 3 and 4, the level shift resistances both on the ON/OFF sides, the threshold values of the buffers both on the ON/OFF sides, relative variations in the current mirror ratios both on the ON/OFF sides, or the like, a difference in the timing can be allowed within a certain range since there is enough time until the S signal and the R signal are transmitted to the Set-Reset Flip-Flop 6 thanks to the effect of the filter constituted of the capacitors 40 and 41. Specifically, if the difference in the timing for the generation of the signals in the ON-side signal generating circuit 20 and the OFF-side signal generating circuit 21 is 200 ns or less as discussed above, the difference can be allowed.

By changing the mirror ratio in the current mirror circuits 10 and 11, it is possible to adjust the filtering time to a desired value and provide a relatively long filtering time with small capacity.

By making the drain current in the normal case sufficiently larger than the displacement current which is expected to occur in the case of change of the VS potential, it is possible to decrease the effect on the delay in transmission in the normal case to as small as possible. Further, it is possible to increase the filtering effect at the time when the dV/dt is applied, more specifically, the effect that the discharge of the ON driven electric charges and the OFF driven electric charges starts earlier than the transmission of the S signal and the R signal to the Set-Reset Flip-Flop 6 and the effect that a relative variation among the transmission systems on ON/OFF sides is allowed.

A-3. Effect

In the first preferred embodiment of the present invention, since the semiconductor circuit comprises the capacitor 40 serving as the first capacitor for charging the ON driven electric charges in response to the ON driving signal, the capacitor 41 serving as the second capacitor for charging the OFF driven electric charges in response to the OFF driving signal, the signal generating circuit 20 serving as the first signal generating circuit for generating the first trigger signal in response to the ON driving signal, the signal generating circuit 21 serving as the second signal generating circuit for generating the second trigger signal in response to the OFF driving signal, the discharging circuit 30 serving as the ON driven electric charge discharging circuit for discharging the ON driven electric charges in response to the second trigger signal, and the discharging circuit 31 serving as the OFF driven electric charge discharging circuit for discharging the OFF, driven electric charges in response to the first trigger signal, it is possible to prevent any malfunction of the P-side semiconductor switching device 7 without being affected by any external factor even if the dV/dt is applied beyond the time period while the one-shot signals are inputted to the high voltage transistors 3 and 4.

Further, in the semiconductor circuit of the first preferred embodiment of the present invention, the capacitor 40 serving as the first capacitor and the capacitor 41 serving as the second capacitor charge the ON driven electric charges or the OFF driven electric charges, respectively, during the time period t=CV/I where I, C, and V represent the current value, the capacitance value, and the threshold value of a subsequent-stage buffer, respectively. It is thus possible to constitute a filter of the capacitors 40 and 41 to thereby discharge the ON driven electric charges and the OFF driven electric charges with the first trigger signal and the second trigger signal from the signal generating circuit 21 and the signal generating circuit 20 at a timing earlier than the transmission of the S signal and the R signal to the Set-Reset Flip-Flop 6 and therefore possible to prevent any malfunction of the P-side semiconductor switching device 7.

B. The Second Preferred Embodiment

B-1. Constitution

Figure 3:
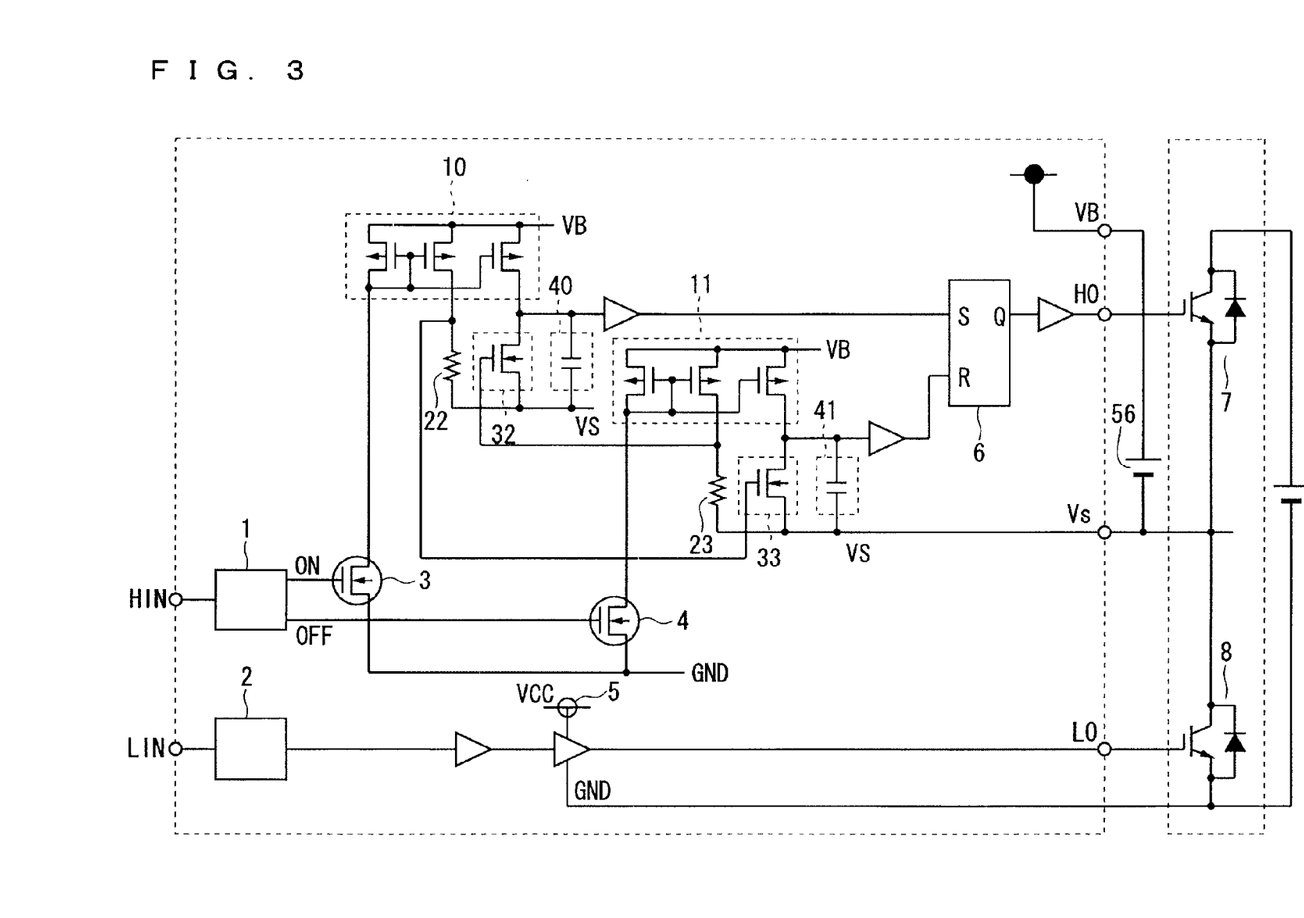
FIGS. 3 and 4 are circuit diagrams each showing a semiconductor circuit in accordance with a second preferred embodiment.

FIG. 3 is a circuit diagram showing a basic configuration of a semiconductor circuit comprising signal generating resistors 22 and 23 serving as the first and second signal generating circuits, respectively, instead of the signal generating circuits 20 and 21 in the first preferred embodiment, and discharging NMOSes (N-Channel Metal-Oxide Semiconductor Field Effect Transistors) 32 and 33 serving as the ON driven electric charge discharging circuit and the OFF driven electric charge discharging circuit, respectively, instead of the discharging circuits 30 and 31.

Since the signal generating resistors 22 and 23 are used to generate signals in the circuit configuration of the second preferred embodiment, it is possible to generate simplified pulse signals by using the currents transmitted from the current mirror circuits 10 and 11 and the resistance values in the signal generating resistors 22 and 23.

Further, since an NMOSFET is used as a discharging element, it is possible to easily set a timing for discharge and simplify the circuit configuration.

Figure 4:
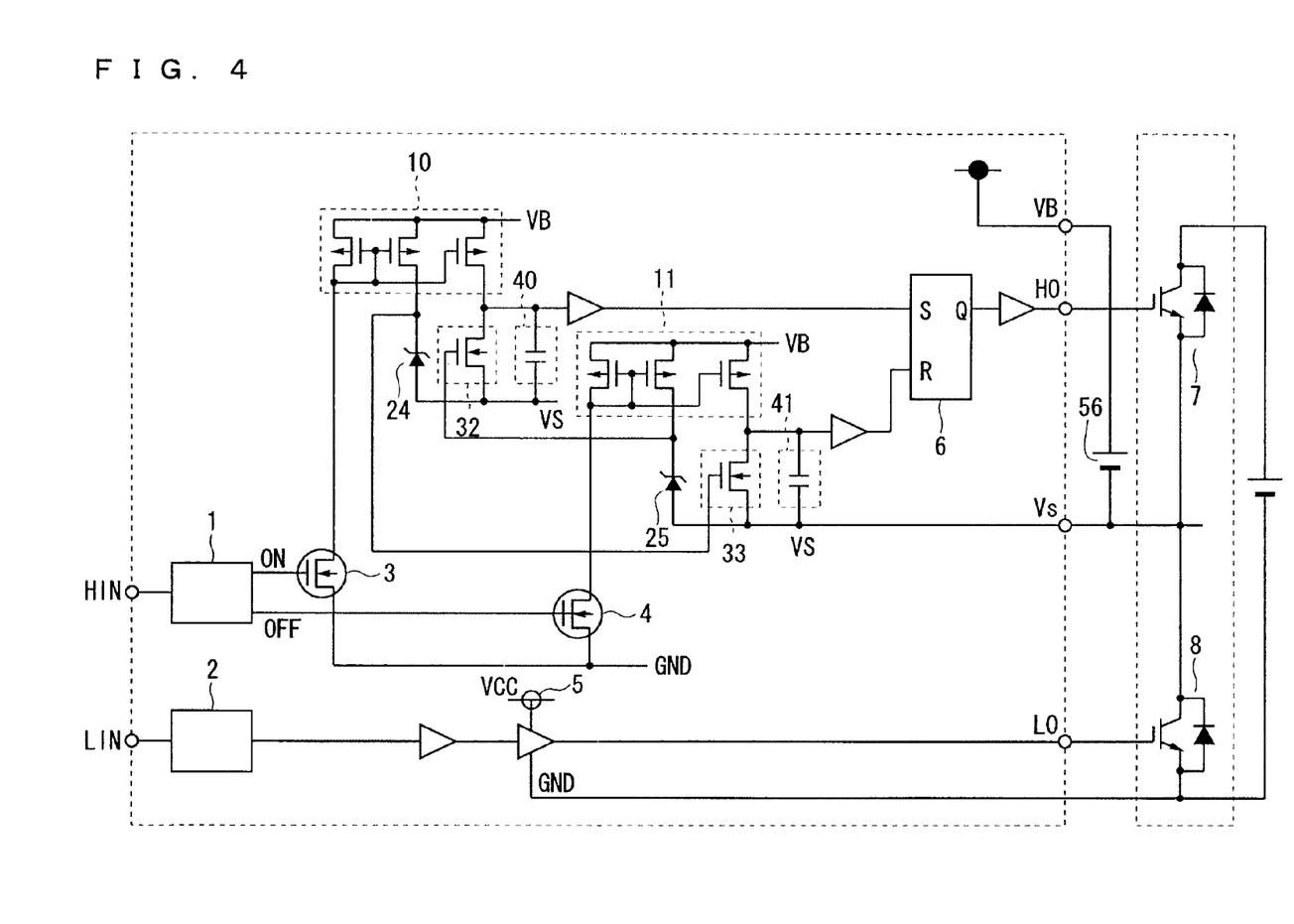

FIG. 4 is a circuit diagram showing a basic configuration of a semiconductor circuit comprising Zener diodes 24 and 25 serving as the first and second signal generating circuits, respectively, instead of the signal generating circuits 20 and 21 in the first preferred embodiment, and discharging NMOSes 32 and 33, instead of the discharging circuits 30 and 31.

Since the Zener diodes 24 and 25 are used to generate signals in the circuit configuration of the second preferred embodiment, it is possible to generate a constant voltage signal by using the currents transmitted from the current mirror circuits 10 and 11. Further, it is possible to simplify the circuit configuration.

C. The Third Preferred Embodiment

C-1. Constitution

Figure 5:
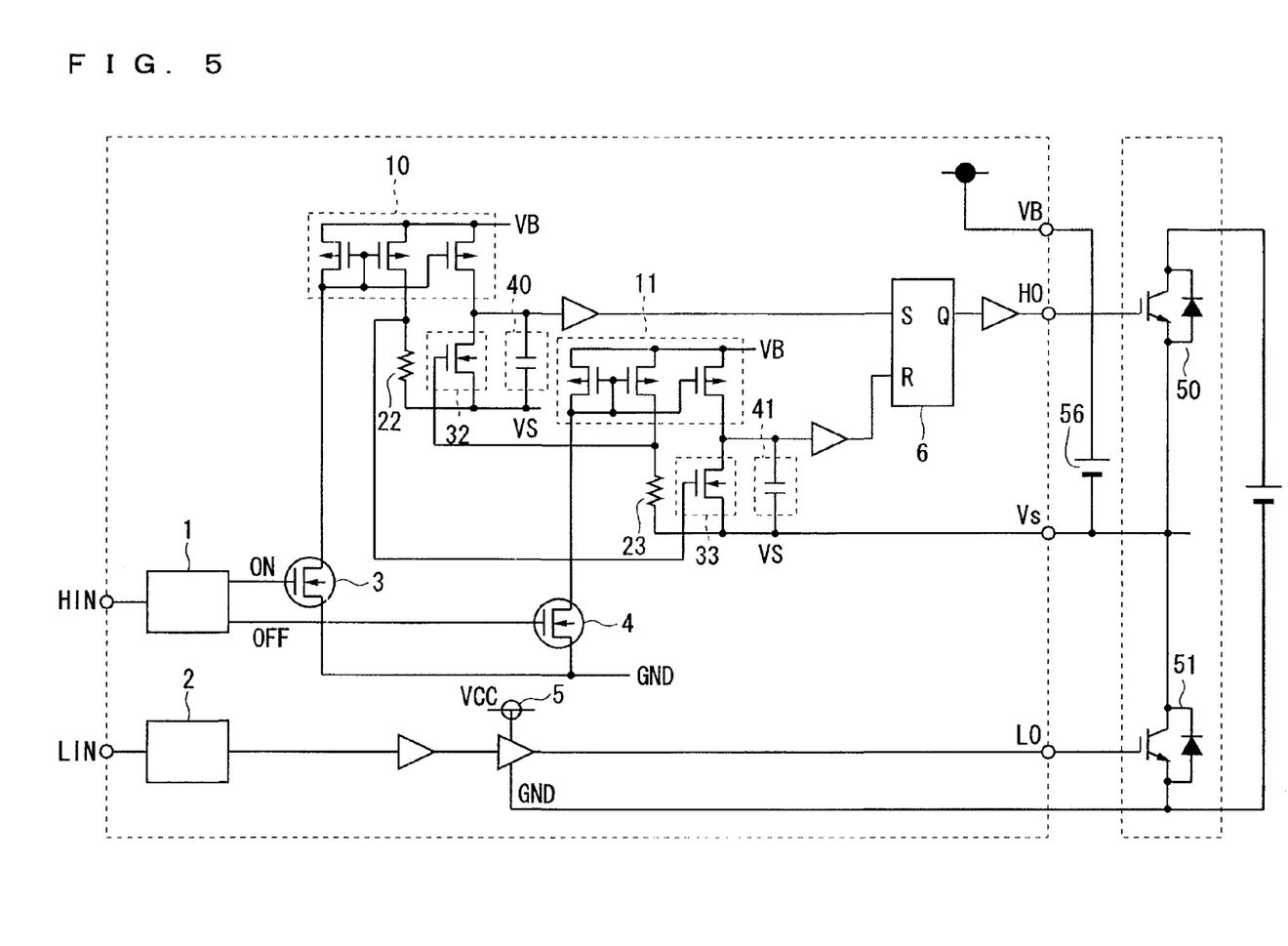
FIGS. 5 to 7 are circuit diagrams each showing a semiconductor circuit in accordance with a third preferred embodiment.

FIG. 5 is a circuit diagram showing a basic configuration of a semiconductor circuit comprising a P-side semiconductor switching device 50 and an N-side semiconductor switching device 51 each having a SiC (silicon carbide) free wheel diode, instead of the P-side semiconductor switching device 7 and the N-side semiconductor switching device 8 in the second preferred embodiment (FIG. 3).

With such a configuration, the semiconductor circuit has high heat resistance and high heat radiation, and this allows size reduction of a semiconductor module.

Figure 6:
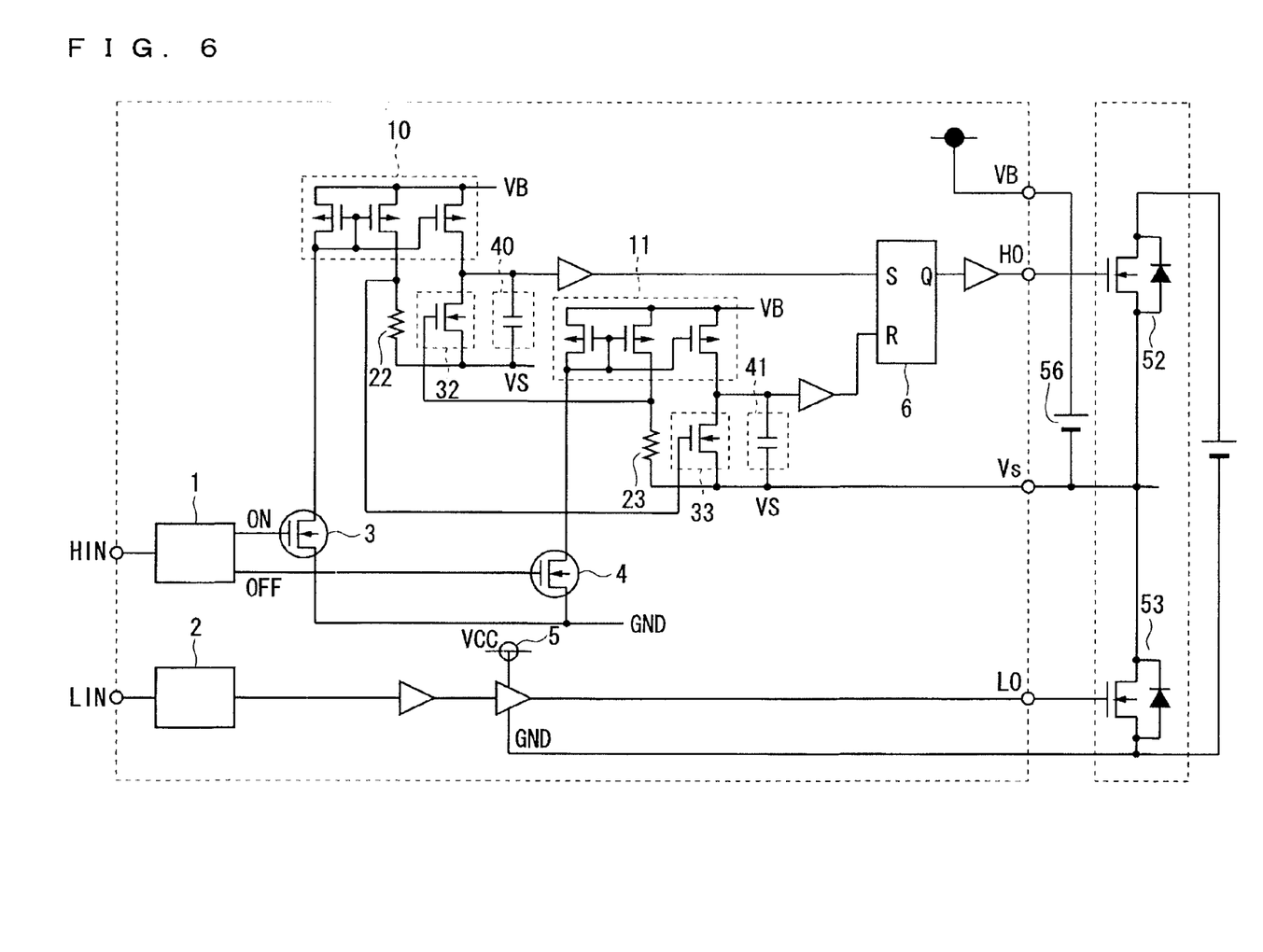

FIG. 6 is a circuit diagram showing a basic configuration of a semiconductor circuit comprising a P-side semiconductor switching device 52 and an N-side semiconductor switching device 53 each having a SiCMOSFET, instead of the P-side semiconductor switching device 7 and the N-side semiconductor switching device 8 in the second preferred embodiment (FIG. 3).

In such a configuration, the SiCMOSFET achieves low loss, and high efficiency allows size reduction.

Figure 7:
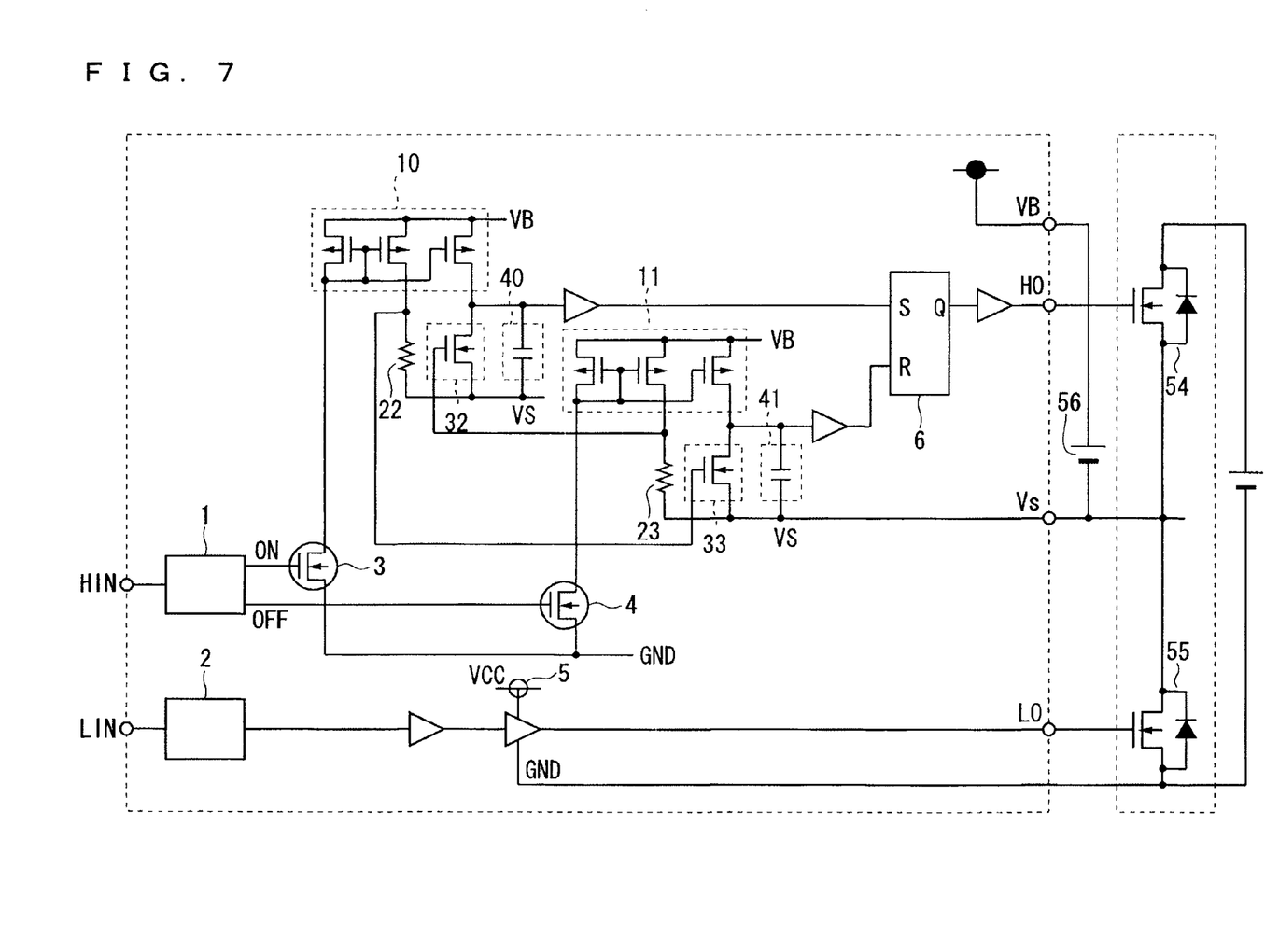

Further, FIG. 7 is a circuit diagram showing a basic configuration of a semiconductor circuit comprising a P-side semiconductor switching device 54 and an N-side semiconductor switching device 55 each having both a SiC free wheel diode and a SiCMOSFET, instead of the P-side semiconductor switching device 7 and the N-side semiconductor switching device 8 in the second preferred embodiment (FIG. 3).

With such a configuration, high heat resistance and high heat radiation allow size reduction of a semiconductor module. Further, the SiCMOSFET achieves low loss, and high efficiency allows size reduction.

D. The Fourth Preferred Embodiment

D-1. Constitution

Figure 8:
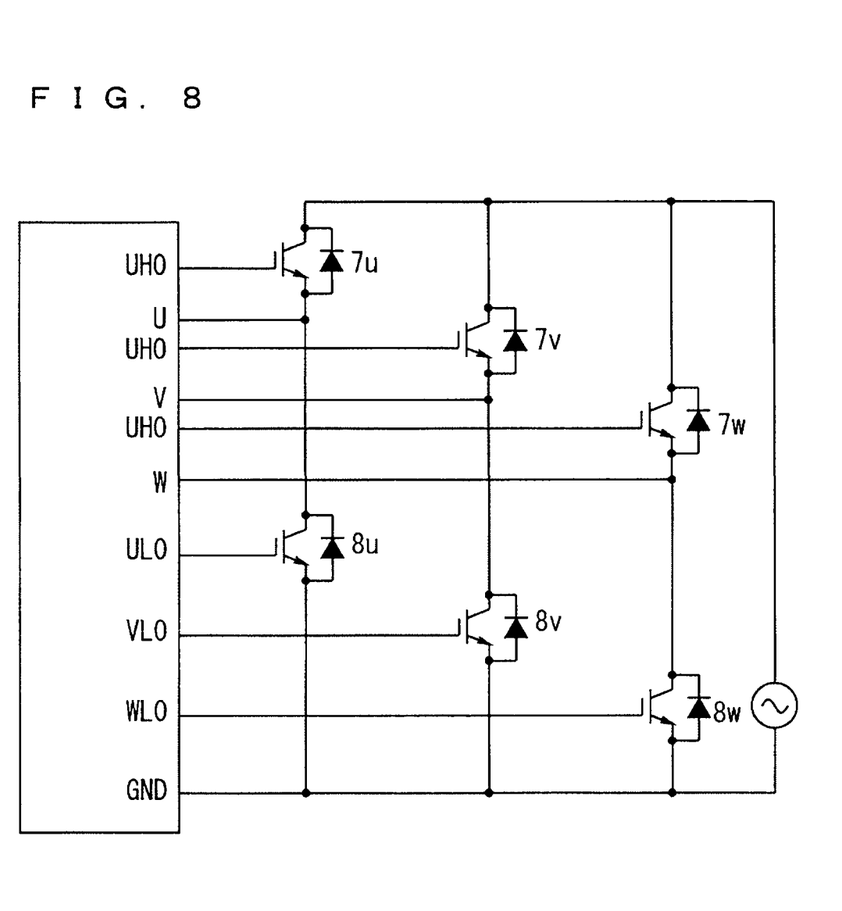
FIG. 8 is a view showing a configuration of a semiconductor switching device in a semiconductor circuit in accordance with a fourth preferred embodiment.

FIG. 8 is a view showing a configuration for driving a semiconductor switching device having a plurality of phases. As shown in FIG. 8, the semiconductor switching device has a plurality of phases, comprising a P-side semiconductor switching device 7u, a P-side semiconductor switching device 7v, a P-side semiconductor switching device 7w, an N-side semiconductor switching device 8u, an N-side semiconductor switching device 8v, and an N-side semiconductor switching device 8w.

With such a configuration, it is possible to achieve simplification and size reduction of circuit board routing by using IPM (Intelligent Power Module) or the like.

E. The Fifth Preferred Embodiment

E-1. Constitution

Figure 9:
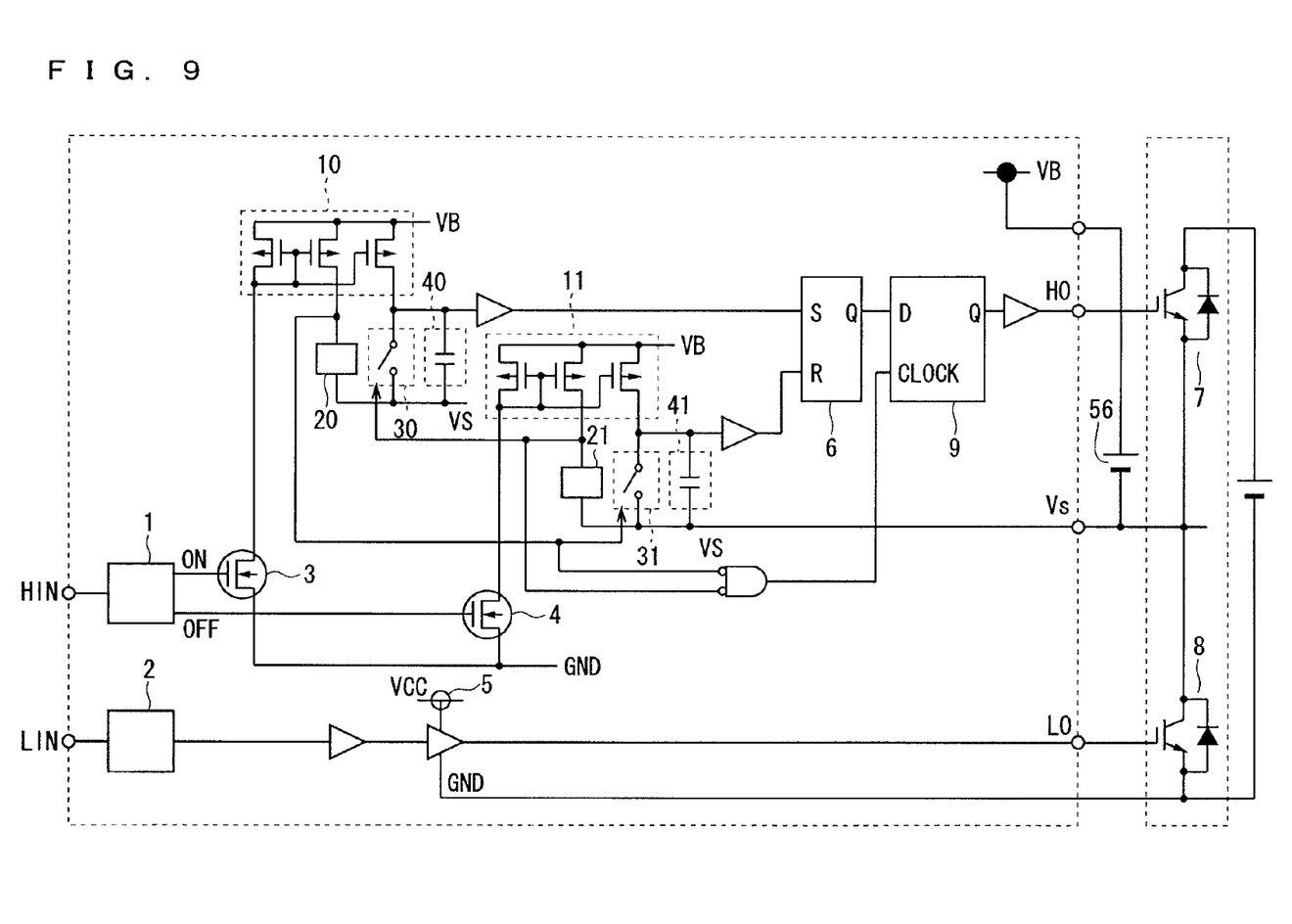
FIG. 9 is a circuit diagram showing a semiconductor circuit in accordance with a fifth preferred embodiment.

FIG. 9 is a circuit diagram showing a semiconductor circuit further having a Delay-type Flip-Flop 9 besides the constituent elements of the first preferred embodiment (FIG. 1).

In the semiconductor circuit of the fifth preferred embodiment, the P-side semiconductor switching device 7 and the N-side semiconductor switching device 8 are operated at a rise timing of a signal taking the NOR of the On-side signal generating circuit 20 and the OFF-side signal generating circuit 21. In other words, a clock timing of the Delay-type Flip-Flop 9 is made coincident with the fall timing of the one-shot signal.

By making a difference between the timing when the VS potential is changed and the timing of the one-shot signal, the dV/dt is applied at the timing when both the high voltage transistors 3 and 4 are surely in an OFF state.

Since respective values of the displacement currents flowing in the ON-side high voltage transistor 3 and the OFF-side high voltage transistor 4 are made equal when the dV/dt is applied, it is possible to prevent a difference in the timing for coincidence signals on the ON/OFF sides from occurring due to the dV/dt and surely prevent any malfunction.

In the preferred embodiments of the present invention, the quality, the material, conditions, and the like of each constituent element are discussed, but these are only examples and not restrictive.

While the invention has been shown and described in detail, the foregoing description is in all aspects illustrative and not restrictive. It is therefore understood that numerous modifications and variations can be devised without departing from the scope of the invention.

What is claimed is:

1. A semiconductor circuit comprising:
   an output circuit for outputting an ON driving signal as a first positive pulse during a first time period and an OFF driving signal as a second positive pulse during a second time period;
   a first capacitor for charging ON driven electric charges in response to said ON driving signal;
   a second capacitor for charging OFF driven electric charges in response to said OFF driving signal;
   a first signal generating circuit for generating a first trigger signal in response to said ON driving signal;
   a second signal generating circuit for generating a second trigger signal in response to said OFF driving signal;
   an ON driven electric charge discharging circuit for discharging said ON driven electric charges capacitor in response to said second trigger signal;
   an OFF driven electric charge discharging circuit for discharging said OFF driven electric charges of in response to said first trigger signal;
   a Set-Reset Flip-Flop which operates in response to said ON driven electric charges and said OFF driven electric charges which are charged thereto; and
   a Delay-type Flip-Flop to which an output of said Set-Reset Flip-Flop and an NOR output of said first trigger signal and said second trigger signal are inputted.

2. The semiconductor circuit according to claim 1, wherein said first capacitor and said second capacitor charge said ON driven electric charges or said OFF driven electric charges, respectively, during a time period $t=CV/I$, where I, C, V represent a current value, a capacitance value, and a threshold value of the subsequent-stage buffer, respectively.

3. The semiconductor circuit according to claim 1, wherein said first signal generating circuit and said second signal generating circuit are each a signal generating resistor.

4. The semiconductor circuit according to claim 1, wherein said first signal generating circuit and said second signal generating circuit are each a Zener diode.

5. The semiconductor circuit according to claim 1, wherein said ON driven electric charge discharging circuit and said OFF driven electric charge discharging circuit are each an NMOSFET.

6. A semiconductor device, comprising:
   a semiconductor circuit as defined in claim 1; and
   a high-side semiconductor switching device which operates in response to said ON driven electric charges and said OFF driven electric charges which are charged in said semiconductor circuit.

7. The semiconductor device according to claim 6, wherein said high-side semiconductor switching device comprises a wide bandgap semiconductor free wheel diode.

8. The semiconductor device according to claim 6, wherein said high-side semiconductor switching device comprises a wide bandgap semiconductor MOSFET.

9. The semiconductor device according to claim 6, wherein said high-side semiconductor switching device comprises a plurality of phases.

10. The semiconductor circuit according to claim 1, further comprising:
    a first high voltage transistor that receives the ON driving signal from the output circuit;
    a second high voltage transistor that receives the OFF driving signal from the output circuit;
    a first current mirror circuit into which a drain current flows from the first high voltage transistor, wherein the first signal generating circuit receives a current output from the first current mirror circuit; and
    a second current mirror circuit into which a drain current flows from the second high voltage transistor, wherein the second signal generating circuit receives a current output from the second current mirror circuit.

* * * * *